United States Patent
Fovell et al.

(10) Patent No.: US 11,915,850 B2
(45) Date of Patent: Feb. 27, 2024

(54) TWO CHANNEL COSINE-THETA COIL ASSEMBLY

(71) Applicant: APPLIED MATERIALS, INC., Santa Clara, CA (US)

(72) Inventors: Richard C. Fovell, San Jose, CA (US); Kartik Ramaswamy, San Jose, CA (US); Larry D. Elizaga, Tracy, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 1074 days.

(21) Appl. No.: 15/848,856

(22) Filed: Dec. 20, 2017

(65) Prior Publication Data

US 2019/0189330 A1 Jun. 20, 2019

(51) Int. Cl.
| | |
|---|---|
| *H01F 27/08* | (2006.01) |
| *H01F 27/28* | (2006.01) |
| *H01J 37/32* | (2006.01) |
| *H01L 21/67* | (2006.01) |

(52) U.S. Cl.
CPC ............ *H01F 27/08* (2013.01); *H01F 27/28* (2013.01); *H01F 27/2876* (2013.01); *H01J 37/321* (2013.01); *H01J 37/3244* (2013.01); *H01L 21/67069* (2013.01); *H01J 2237/334* (2013.01); *H01L 21/67109* (2013.01)

(58) Field of Classification Search
CPC ...... H01F 27/08; H01F 27/28; H01F 27/2876; H01L 21/3244
USPC ....................................................... 219/677
See application file for complete search history.

(56) References Cited

U.S. PATENT DOCUMENTS

| | | |
|---|---|---|
| 6,015,476 A | 1/2000 | Schlueter et al. |
| 6,034,346 A | 3/2000 | Yoshioka et al. |
| 6,066,568 A | 5/2000 | Kawai et al. |

(Continued)

FOREIGN PATENT DOCUMENTS

| | | | |
|---|---|---|---|
| CN | 106057440 B | 9/2017 | |
| GB | 1573653 | * 4/1977 | ............. B65H 75/18 |

OTHER PUBLICATIONS

Justin Dinale and Julian Vrbancich, "Generation of Long Prolate Volumes of Uniform Magnetic Field in Cylindrical Saddle Shaped Coils," Meas. Sci. Technol. 25, (2014) 035903 (13pp).

(Continued)

*Primary Examiner* — John J Norton
*Assistant Examiner* — Simpson A Chen
(74) *Attorney, Agent, or Firm* — MOSER TABOADA

(57) ABSTRACT

A coil assembly for controlling a magnetic field in a plasma chamber is provided herein. In some embodiments, the coil assembly may include a mandrel including an annular body that includes at least one upper body coolant channel and at least one lower body coolant channel, and a plurality of cooling fins disposed circumferentially about an outer diameter of the body and radially outward from the outer diameter, an inner electromagnetic cosine-theta (cos θ) coil ring including a first set of inner coils wrapped around the plurality of cooling fins in the body and configured to generate a magnetic field in a first direction, an outer electromagnetic cosine-theta (cos θ) coil ring including a second set of outer coils wrapped around the plurality of cooling fins and configured to generate a magnetic field in a second direction orthogonal to the first direction.

20 Claims, 8 Drawing Sheets

(56) References Cited

U.S. PATENT DOCUMENTS

| | | | |
|---|---|---|---|
| 6,103,074 A | 8/2000 | Khominich | |
| 6,172,321 B1 | 1/2001 | Yoshioka et al. | |
| 6,308,654 B1 * | 10/2001 | Schneider | H01J 37/321 |
| | | | 118/723 I |
| 6,464,795 B1 * | 10/2002 | Sherstinsky | C23C 16/45521 |
| | | | 118/715 |
| 6,634,179 B2 | 10/2003 | Heinemann et al. | |
| 7,589,950 B2 | 9/2009 | Parkhe et al. | |
| 8,179,050 B2 | 5/2012 | Chen | |
| 9,613,783 B2 | 4/2017 | Lane et al. | |
| 2007/0267145 A1 | 11/2007 | Kitada et al. | |
| 2008/0296510 A1 | 12/2008 | Kasama et al. | |
| 2014/0117798 A1 | 5/2014 | Coldwate et al. | |
| 2014/0268479 A1 * | 9/2014 | West | H01L 21/6831 |
| | | | 361/234 |
| 2015/0294843 A1 | 10/2015 | Chen et al. | |
| 2016/0027613 A1 * | 1/2016 | Lane | H01J 37/3211 |
| | | | 315/34 |
| 2016/0358761 A1 * | 12/2016 | Atlas | H01J 37/32697 |
| 2017/0162365 A1 | 6/2017 | Lane et al. | |
| 2017/0330670 A1 * | 11/2017 | Rippel | H01F 27/2895 |

OTHER PUBLICATIONS

International Search Report and Written Opinion dated Mar. 11, 2019 for PCT Application No. PCT/US2018/061764.

\* cited by examiner

TWO CHANNEL COSINE-THETA COIL ASSEMBLY

FIELD

Embodiments of the present disclosure generally relate to plasma enhanced semiconductor substrate processing, and more specifically to the physical design and use of a compact two channel cosine-theta coil assembly.

BACKGROUND

Some semiconductor wafer processing chambers are of a type in which a magnetic field is produced within the reaction chamber by providing a plurality of electromagnets around the reaction chamber to accelerate formation of the plasma. These chambers use magnetic fields to manipulate plasma density through electron cyclotron rotation.

However, the inventors have observed that the intensity of the magnetic field tends to be greater on the edge of a substrate placed in the reaction chamber than in the center of the wafer. Therefore, when this method of producing a magnetic field is applied to a plasma etching chamber, there is a problem that the etch rate and the selectivity are not uniform over the substrate surface. When the method is applied to a chemical vapor deposition (CVD) chamber, there is a problem of non-uniformity in the film formation upon the substrate surface. Still another problem is that the electrical components formed on the substrate may suffer charging damage due to a non-uniform plasma density.

The inventors have observed that control of the process plasma distribution in the etch/plasma processing chamber is important for on-wafer uniformity and device yield. Previous low-power "cosine-theta" (cos θ) coil ring designs used to control of the process plasma distribution in the etch/plasma processing chamber were not capable of sustaining the required high current densities do to over-heating of the coil wire. Thus, the inventors have provided an improved two channel cosine-theta coil assembly for controlling a magnetic field in a semiconductor wafer processing chamber capable of sustaining the high current densities.

SUMMARY

A coil assembly for controlling a magnetic field in a plasma chamber is provided herein. In some embodiments, the coil assembly may include a coil assembly mandrel, comprising an annular body having a central opening, wherein the body includes at least one upper body coolant channel and at least one lower body coolant channel fluidly coupled to the upper body coolant channel at a coolant return location in the body, a plurality of cooling fins disposed circumferentially about an outer diameter of the body and radially outward from the outer diameter, wherein at least one of the cooling fins is an active cooling fin, and wherein the active cooling fin comprises an inlet cooling fin channel formed within the active cooling fin that extends radially outward from the body to an outer edge of the active cooling fin, wherein the inlet cooling fin channel is fluidly coupled to the upper body coolant channel, and an outlet cooling fin channel formed within the active cooling fin that extends radially outward from the body to an outer edge of the active cooling fin, wherein the outlet cooling fin channel is fluidly coupled to the lower body coolant channel.

In some embodiments, the coil assembly may include a mandrel comprising an annular body that includes at least one upper body coolant channel and at least one lower body coolant channel fluidly coupled to the upper body coolant channel at a coolant return location in the body, and a plurality of cooling fins disposed circumferentially about an outer diameter of the body and radially outward from the outer diameter, wherein at least one of the cooling fins is an active cooling fin, an inner electromagnetic cosine-theta (cos θ) coil ring including a first plurality of inner coils wrapped around the plurality of cooling fins in the body and configured to generate a magnetic field in a first direction, and an outer electromagnetic cosine-theta (cos θ) coil ring including a second plurality of outer coils wrapped around the plurality of cooling fins and configured to generate a magnetic field in a second direction orthogonal to the first direction.

In some embodiments, an apparatus for processing a substrate may include a process chamber having an internal processing volume, a substrate support disposed in the process chamber to support a substrate when disposed therein, a coil assembly including an aluminum mandrel comprising an annular body that includes at least one upper body coolant channel and at least one lower body coolant channel fluidly coupled to the upper body coolant channel at a coolant return location in the body; and a plurality of cooling fins disposed circumferentially about an outer diameter of the body and radially outward from the outer diameter, wherein at least one of the cooling fins is an active cooling fin; an inner electromagnetic cosine-theta (cos θ) coil ring including a first plurality of inner coils wrapped around the plurality of cooling fins in the body and configured to generate a magnetic field in a first direction; and an outer electromagnetic cosine-theta (cos θ) coil ring including a second plurality of outer coils wrapped around the plurality of cooling fins and configured to generate a magnetic field in a second direction orthogonal to the first direction.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
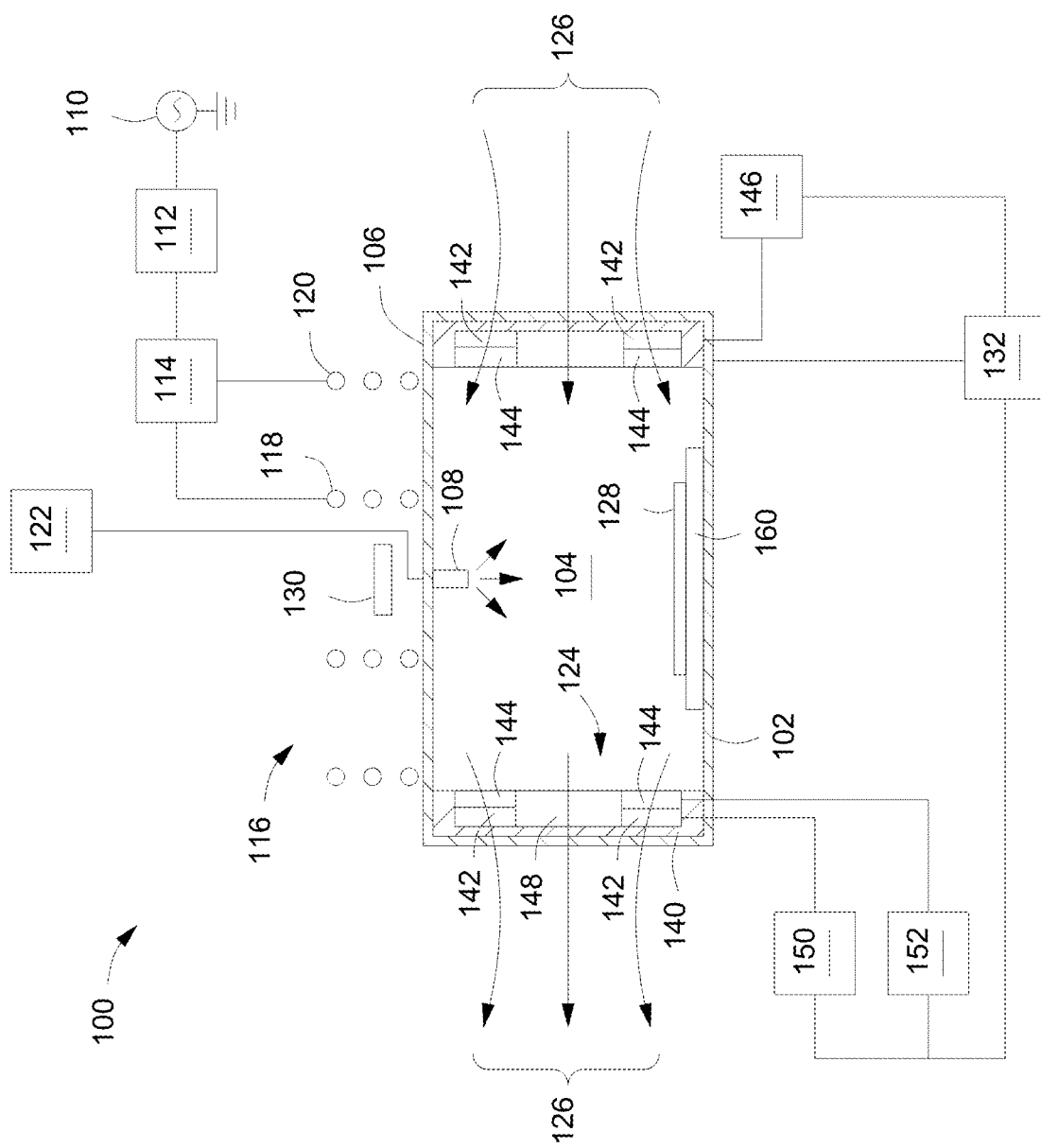
FIG. 1 depicts a schematic side view of an inductively coupled plasma reactor in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments consistent with the present disclosure include the physical design of a two channel cosine-theta coil assembly in a compact coil form. The cosine-theta coil assembly described herein, and associated methods, could be used in any plasma etching process where a uniform magnetic field can be used to enhance center to edge etch uniformity. Embodiments of the cosine-theta coil assembly are designed to co-locate both coils formed around the same inner diameter to retain the coils at or near the substrate surface plane during plasma processing. The assembly includes internal cooling channels designed to advantageously maintain the coil temperatures below the maximum operating temperature of the coil wire material. Combining the two coils into a compact wire form advantageously allows for the inclusion of an integral cooling loop that cools both of the coils. In addition, the compact coil packaging arranges the magnetic field from both coils into a single plain uniform field directions that can be synchronized to produce a uniform planar rotating magnetic field of constant magnitude. Furthermore, embodiments consistent with the present disclosure advantageously use a cosine-theta magnetic field effect on the process plasma at high current densities without over-heating the coil wire.

Other advantages of the cosine-theta coil assemblies described herein include the compact packaging of the two cosine-theta coils on a single cooled winding mandrel. The ability to package the coils tightly together allow the two coils to produce a very uniform magnetic field at the wafer level and enhance the ability to "spin" the magnetic field at the wafer center in a uniform plane above the substrate. The magnitude of the magnetic field is only limited by the magnet current power supplies and the cooling effect of the coolant flowing through the mandrel.

Furthermore, embodiments of the present disclosure may advantageously reduce, control, or eliminate skew on a substrate that is induced by magnetic fields used in industrial plasma etch reactors. Skew generally refers to the difference in process results from one region of the substrate to another, such as left vs. right, center vs. edge, top vs. bottom of a feature, or the like (e.g., skew refers to the pattern of non-uniformity on the substrate). Skew in the substrate uniformity could also be related to, or otherwise caused by, the previous chamber used to process the substrate in the process sequence, the flow or pump or thermal asymmetries, or asymmetrical power delivery by the RF power applicator that generates plasma. Skew can be used to characterize process results such as critical dimension (CD) uniformity, etch depth uniformity, or other process results. The inventors have observed that a large volume field programmable constant transverse B-field is one way to influence plasma uniformity and direction. Thus, a method to generate and control the magnitude and direction of a constant transverse B-field in a plasma chamber is provided to manipulate plasma uniformity and direction to correct for skews. More specifically, a method to generate and control a field programmable "cosine-theta" (cos θ) coil system in an embedded liner of a substrate process chamber is provided herein to advantageously correct for skew.

FIG. 1 depicts a schematic side view of an inductively coupled plasma reactor 100 (ICP reactor) suitable for performing embodiments of the present disclosure. The ICP reactor 100 may be utilized alone or, as a processing module of an integrated semiconductor substrate processing system, or cluster tool, such as a CENTURA® integrated semiconductor wafer processing system, available from Applied Materials, Inc. of Santa Clara, California Examples of suitable plasma reactors that may advantageously benefit from modification in accordance with embodiments of the present disclosure include the CENTRIS™ SYM3™ ETCH chambers, inductively coupled plasma etch reactors such as the DPS® line of semiconductor equipment or other inductively coupled plasma reactors, such as MESA™ or the like also available from Applied Materials, Inc. The above listing of semiconductor equipment is illustrative only, and other etch reactors, and non-etch equipment (such as CVD reactors, or other semiconductor processing equipment) may also be suitably modified in accordance with the present teachings.

The reactor 100 generally includes the process chamber 102 having a conductive body (wall) with chamber liner 140, and a dielectric lid 106 (that together define a processing volume 104), a substrate support pedestal 160 disposed within the processing volume to support a substrate 128, an inductive plasma source 116, and a controller 132. In some embodiments, the dielectric lid 106 may be substantially flat. Other modifications of the process chamber 102 may have other types of lids such as, for example, a dome-shaped lid or other shapes. The inductive plasma source 116 is typically disposed above the lid 106 and is configured to inductively couple RF power into the process chamber 102.

The inductive plasma source 116 is disposed atop the process chamber 102. The inductive plasma source includes an RF feed structure for coupling an RF power supply 110 to a plurality of RF coils, e.g., a first RF coil 118 and a second RF coil 120. The plurality of RF coils are coaxially disposed proximate the process chamber 102 (for example, above the lid 106 of the process chamber 102) and are configured to inductively couple RF power into the process chamber 102 to form or control a plasma from process gases provided within the process chamber 102 (for example, via a gas source 122 coupled to a gas inlet 108, such as a showerhead or nozzle or the like). The relative position, ratio of diameters of each coil, and/or the number of turns in each coil can each be adjusted as desired to control, for example, the profile or density of the plasma being formed via controlling the inductance on each coil.

The RF power supply 110 is coupled to the RF feed structure via a match network 112. A power divider 114 may be provided to adjust the RF power respectively delivered to the first and second RF coils 118, 120. The power divider 114 may be coupled between the match network 112 and the RF feed structure. Alternatively, the power divider may be a part of the match network 112, in which case the match network will have two outputs coupled to the RF feed structure—one corresponding to each RF coil 118, 120. The RF power supply 110 may illustratively be capable of producing up to about 5 kW (but not limited to 5 kW) at a tunable frequency in a range from 50 kHz to 200 MHz, although other frequencies and powers may be provided as desired for particular applications.

The controller 132 comprises a central processing unit (CPU), a memory, and support circuits for the CPU and facilitates control of the components of the reactor 100 and, as such, of methods of processing a substrate, such as discussed herein. The controller 132 may be one of any form of general-purpose computer processor that can be used in an industrial setting for controlling various chambers and sub-processors. The memory, or computer-readable medium, of the CPU may be one or more of readily available memory such as random access memory (RAM), read only memory (ROM), floppy disk, hard disk, or any other form of digital storage, local or remote. The support circuits are coupled to the CPU for supporting the processor in a conventional manner. These circuits include cache, power supplies, clock circuits, input/output circuitry and subsystems, and the like. The memory stores software (source or object code) that may be executed or invoked to control the operation of the reactor 100 in the manner described below. Specifically, memory stores one or more embodiments of the methods disclosed herein, such as the method 400 discussed above. The software routine may also be stored and/or executed by a second CPU (not shown) that is remotely located from the hardware being controlled by the CPU.

A coil assembly 124 including a plurality of electromagnets is provided to form a desired magnetic field (e.g., as represented by magnetic field lines 126) within the inner volume, or processing volume 104, of the process chamber 102 at least at the substrate level 128, or in some embodiments, within the entire processing volume 104 above the substrate. One or more magnetic field sensors 130 may be provided to measure the magnitude and direction of the magnetic field as discussed above. The coil assembly 124 may include an outer ring of electromagnetic coils 142 and an inner ring of electromagnet coils 144. The outer and inner rings of coils 142, 144 may be disposed concentrically and coaxially with respect to one another.

In some embodiments, the plurality of coil assembly 124 may be disposed about the processing volume of the process chamber 102. In some embodiments, the coil assembly 124 may be disposed circumferentially along the inner surface a wall of process chamber 102 or circumferentially along the inner surface of a liner 140 (also referred to as a magnet cover). In some embodiments, the liner 140 may be grounded such that the coil assembly 124 has little to no impact on the RF return currents induced by RF power supply 110. The purpose of the liner 140 is to prevent leakages in the B-Field out into the semiconductor fabrication (fab) environment such that it doesn't affect other processes, chambers, or otherwise affect some other instrumentation in the fab (i.e., it drops the local B-Field down to very low level, and it's safe to the touch, it's safe from an instrumentation point of view, it's safe from a health endangerment point of view). Thus, the liner 140 confines/limits the magnetic field from going outside the chamber. The liner 140 may be made of a conductive metal or other conductive material. For example, in some embodiments, the liner 140 may be formed from an aluminum alloy or a painted steel. The coil assembly 124 may be electrically insulated from the conductive liner. In some embodiments, the liner may be made from a non-conductive composite material. The liner 140 may be a double walled liner having an inner wall and an outer wall. In some embodiments, one of the inner or outer walls may be formed from a non-conductive material and include the coil assembly 124 embedded within the wall, while the other wall is made from a conductive metal material that is ground. In some embodiments, the coil assembly 124 and/or the liner 140 may be temperature controlled. For example, a heat control device 146 (i.e., heater or cooling device) may be coupled to coil assembly 124 and/or the liner 140. The heat control device 146 may be controlled by controller 132. In some embodiments, the heat control device 146 may provide liquid or gas coolant to be flowed through the coil assembly 124 to cool the coil assembly 124 as discussed below in further detail. In some embodiments, the liner 140 may be heated by heater 146 to a desired temperature, before or after the current is provided to coils 142, 144 by power supplies 150, 152. The liner may be heated to a temperature of about 18° C. to about 150° C. Heating the liner 140 advantageously reduces material (e.g., polymer) deposition on the liner wall during substrate processing that utilize gases that are polymerizing gas. Thus, heating the liner 140 advantageously reduces process chamber contamination and chamber cleaning time. Also, when heating the liner 140 advantageously matches the temperature of the liner 140 with other parts of chamber, such as a showerhead or ceramic lead, to reduce temperature variation inside the chamber.

As noted above, the coil assembly 124 includes an outer ring of electromagnetic coils 142 and an inner ring of electromagnet coils 144. The coils 142 and 144 are wrapped around an annular mandrel 148. In some embodiments, the mandrel 148 is formed from aluminum. In some embodiments, the aluminum is hard anodized. In other embodiments, the mandrel may be formed from other materials that have similar thermal conductivity and electrical conductivity properties as aluminum. The mandrel 148 is described in further detail with respect to FIGS. 2A-2C and FIG. 3.

Figure 2A:
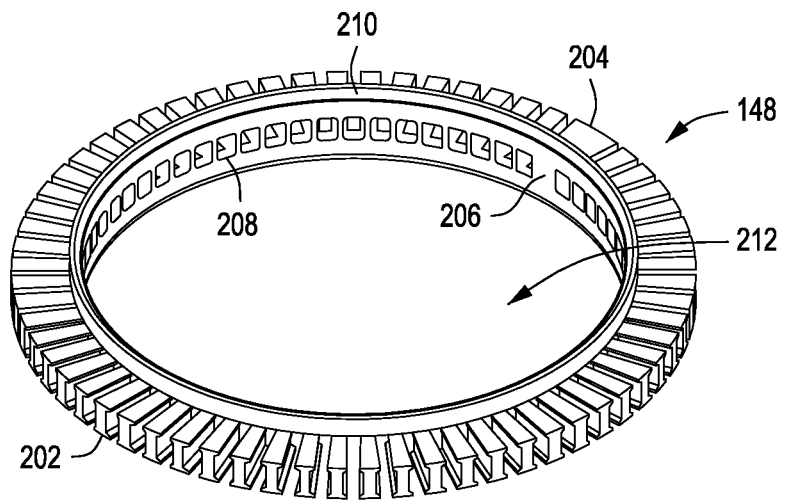
FIG. 2A-C depict an isometric view, top view, and side view of the annular mandrel of the coil assembly in accordance with some embodiments of the present disclosure.
Figure 2B:
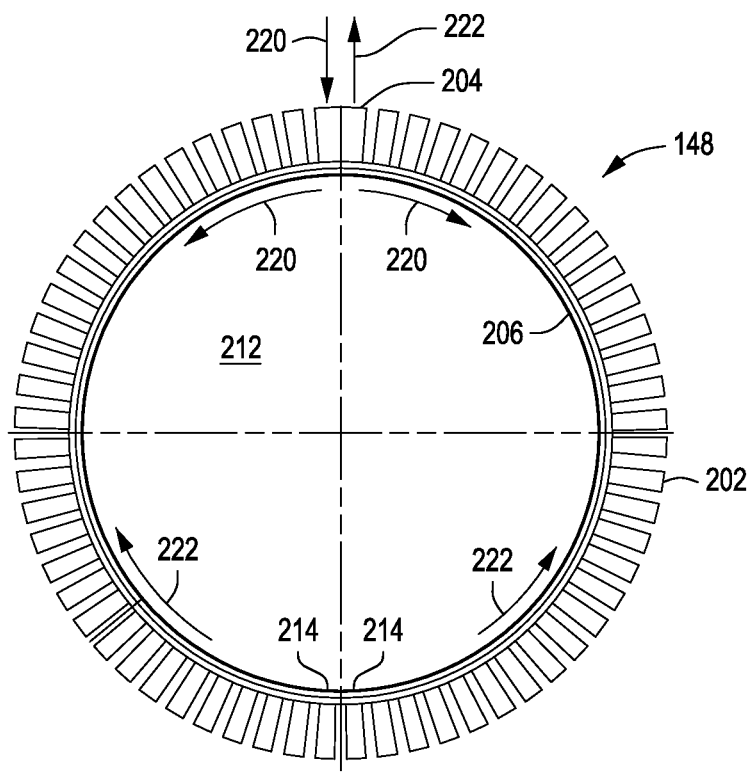
Figure 2C:
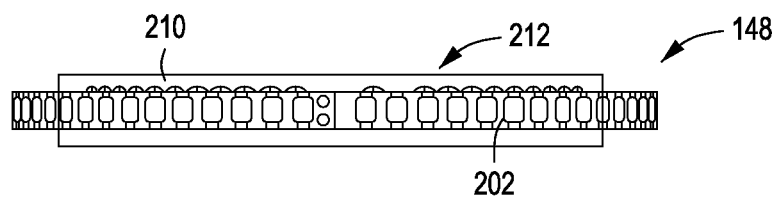

As shown in FIGS. 2A-2C, mandrel 148 includes a mandrel body 206 having a central opening 212. The central opening 212 is configured to allow the coil assembly 124 to be disposed in processing chamber 100 and about processing volume 104. The mandrel 148 further includes a plurality of cooling fins 202 uniform distributed circumferentially and uniformly about the outer diameter of the mandrel body 206. In some embodiments, the cooling fins 202 may be integrally formed with the body 206. In other embodiments, the cooling fins 202 may be attached to the body via welding (i.e., Electron-beam welding (EBW) or other type of welding), glues, or other types of fasteners to securely couple the cooling fins 202 to the body 206. In some embodiments, a plurality of openings 208 are formed through the cylindrical wall of the body 206. The openings 208 are formed between the cooling fins 202 and advantageously promote airflow and cooling of the coil assembly 124 (i.e., of the mandrel 148 and of the coils 142, 144). The body 206 includes upper and lower flanges 210 which help secure and align the coils 142, 144 when disposed thereon as shown in FIG. 3.

Each cooling fin 202 may be formed in the shape of an I-beam as shown in FIGS. 2A and 2C. The I-beam structure of the cooling fin 202 advantageously promotes airflow and cooling of the coils 142, 144 that are wrapped around each cooling fin 202. Different fin cross-sections may be used as well, such as rectangular, circular, and the like. Each cooling fin 202 may also include additional through-holes or openings within each fin to advantageously promote airflow and cooling of the coils 142, 144 and the mandrel 148. Furthermore, in some embodiments, the minimum spacing between the cooling fins 202 is determined based on the heat dissipation requirements and coil material being used. The coil assembly 124 can include between about 16 fins to about 128 cooling fins. In some embodiments, the coil assembly 124 can include 63 or 64 cooling fins. When an active cooling fin 204 (described below) is included in the coil assembly 124, the mandrel 148 may include 63 or an odd number of total cooling fins.

In some embodiments, at least one of the cooling fins 202 may be an active cooling fin 204 that facilitates active cooling of the coil assembly 124. FIG. 3 depicts a detailed cross section of an active cooling fin 204. As shown in FIG. 3, a pair of cooling fin channels 302, 304 may be formed in the active cooling fin 204 that extend radially outward from the body 206 to an outer edge of the active cooling fin 204. One of the cooling fin channels (e.g., 302) may be used as an inlet that provides coolant (inlet coolant flow 220) to the coil assembly 124, while the other one of the cooling channels (e.g., 304) may be used as an outlet that removes coolant (outlet coolant flow 222) from the coil assembly 124. In some embodiments, the cooling fin channels 302, 304 can optionally be plugged using plugs 306. The inlet cooling fin channel 302 is fluidly coupled to one or more inlet body channels 308 that are formed in body 206. Similarly, the outlet cooling fin channel 304 is fluidly coupled to at least one outlet body channels 310 that are formed in body 206. The body channels 308 and 310 are fluidly coupled to each other within body 206 at a coolant return location 214 to reverse the flow of the coolant. When a single active cooling fin 204 is used as shown in FIG. 2B, two coolant return locations 214 may be formed within the body 206 at the opposite end of the body 206 (i.e., about 180° from the active cooling fin 204) to fluidly couple two sets of body channels 308, 310 that each traverse 180° of the body 206. Additional active cooling fins 204 and coolant return locations 214 may be used as desired. The body channels 308 and 310 are sealed with caps 312 and 314, respectively. Caps 312 and 314 fluidly seal the body channels 308 and 310. In some embodiments, the caps 312 and 314 are welded (EBW) on to fluidly seals the body channels 308 and 310. The caps 312 and 314 may be formed from the same material as the mandrel 148 as described above. In some embodiments, coolant may be flowed into and through the mandrel 148 at a rate between about 1 gpm to about 20 gpm, or about 4 gpm. The temperature of the coolant may be from 10° C. to about 30° C.

Figure 3:
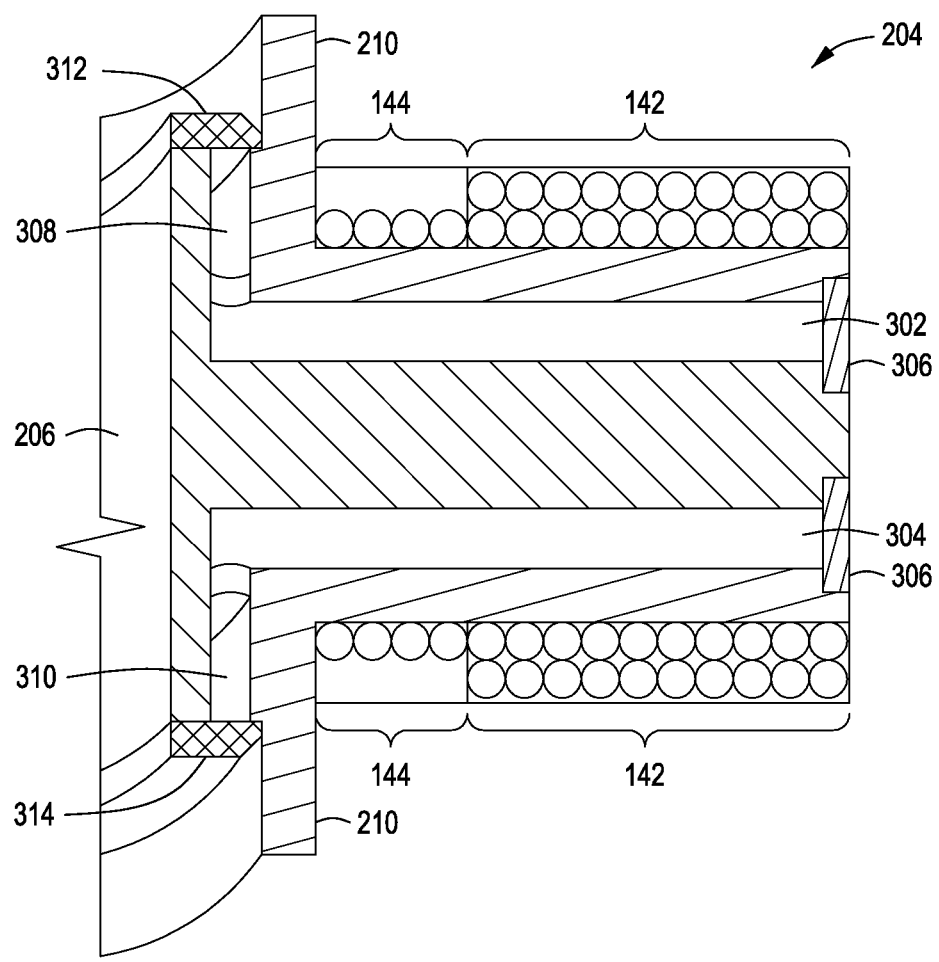
FIG. 3 depicts cross-sectional view of an active cooling fin and mandrel body in accordance with some embodiments of the present disclosure.

FIG. 3 further shows at least one example of the coil wrapping of the inner coils 144 and the outer coils 142. Although this example is about the active cooling fin 204, the coil wrapping is exemplary and can be used about any cooling fin 202. This example shows a combined inner and outer coil with 4 wraps of the inner coil 144 and 18 wraps of the outer coil 142. In some embodiments, the number of coil wraps/layers is no more than two layers thick to improve air-flow to the ICP source. Additional wraps/layers may be used, however, additional layers may require additional cooling to keep the coil temperatures from exceeding their temperature limits.

Figure 4A:
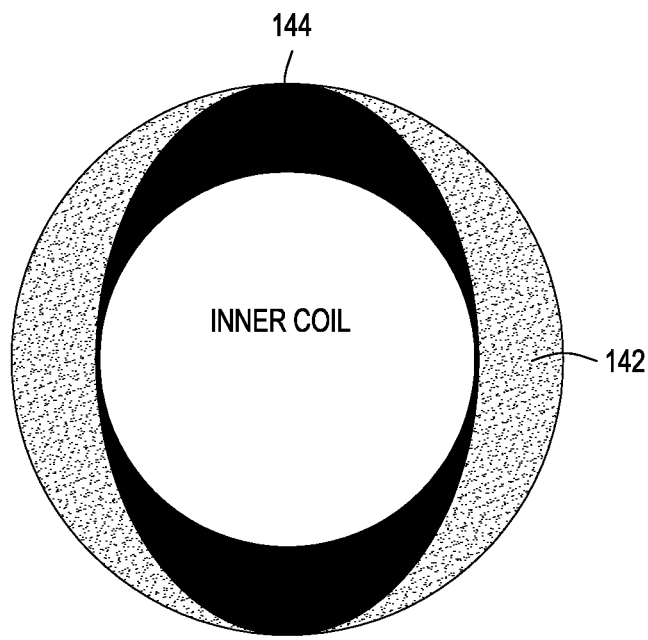
FIG. 4A depicts the shape of the inner coil in accordance with some embodiments of the present disclosure.
Figure 4B:
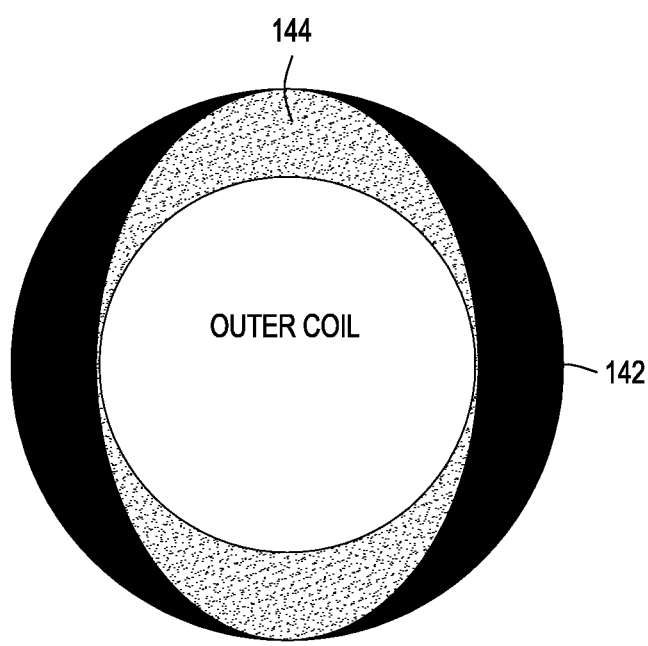
FIG. 4B depicts the shape of the outer coil in accordance with some embodiments of the present disclosure.

FIG. 4A depicts the shape of the inner coil 144 consistent with at least some embodiments of the present disclosure. FIG. 4B depicts the shape of the outer coil 142 consistent with at least some embodiments of the present disclosure.

Figure 5:
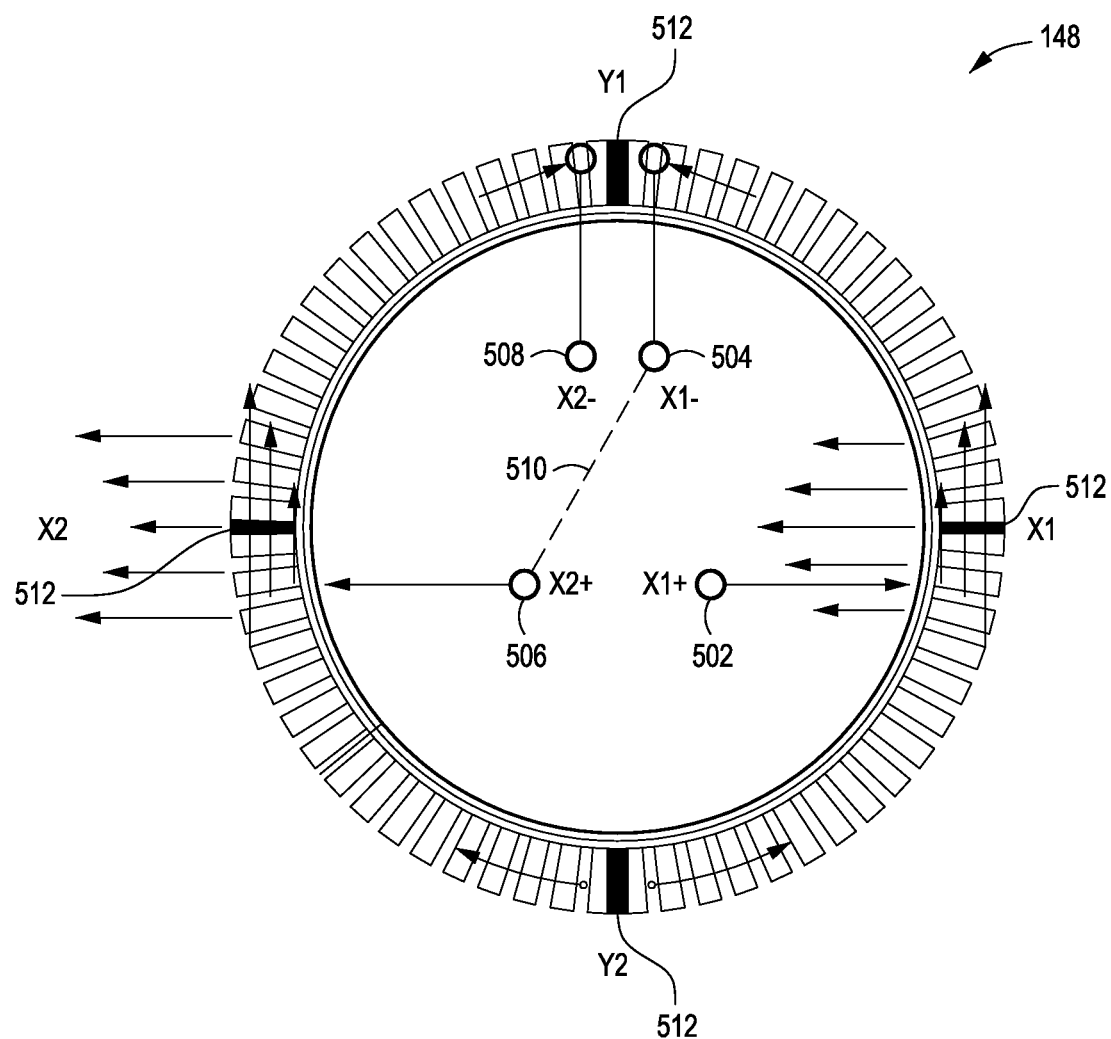
FIG. 5 depicts the further details about the coil assembly which is a cosine-theta X-Y coil in accordance with some embodiments of the present disclosure.

FIG. 5 depicts the further details about the coil assembly 124 which is a cosine-theta X-Y coil. The inner coil is used to produce a "X" direction uniform magnetic field over the wafer and the outer coil is used to produce a "Y" direction uniform magnetic field (the X, Y field orientations are 90 degrees apart). The X coil "+" (high potential) is connected at X1+ (502). The X1 coil is wrapped around the active cooling fin 204 (i.e., the 3 o'clock position in FIG. 5). All X1 coils wrapped as shown with respect to the right hand rule to produce the B-field distribution shown (edge to center). The X coil "−" (low-potential) is connected at X1− (504). The jumper 510 between X1 and X2 connects X1− (504) to X2+ (506). The connection at X2+ (506) drives current through the X2 coils as shown with respect to the right hand rule to produce the b-field distribution shown (center to edge). The X coil "−" (low potential) is connected at X2− (508). In some embodiments, the expected resistance for the X1/X2 combination is 8.6 ohms (14 ga wire). The Y1/Y2 coil pair will have the same pattern offset from the X1/X2 coil pair by 90 degrees. FIG. 5 further shows optional empty spaces 512 that separate each of the quadrants on the cosine-theta X-Y coil.

Each of the outer and inner rings of electromagnetic coils 142, 144 may be coupled to a separate DC power supplies 150, 152 that are independently controlled by controller 132. In some embodiments, each of the outer and inner rings of electromagnetic coils 142, 144 may be coupled to the same power supply. In some embodiments, the DC power supplies 150, 152 are coupled to coils 142, 144 via stationary electric contacts since the constant transverse B-field produced may be rotated non-mechanically as described below.

Figure 6A:
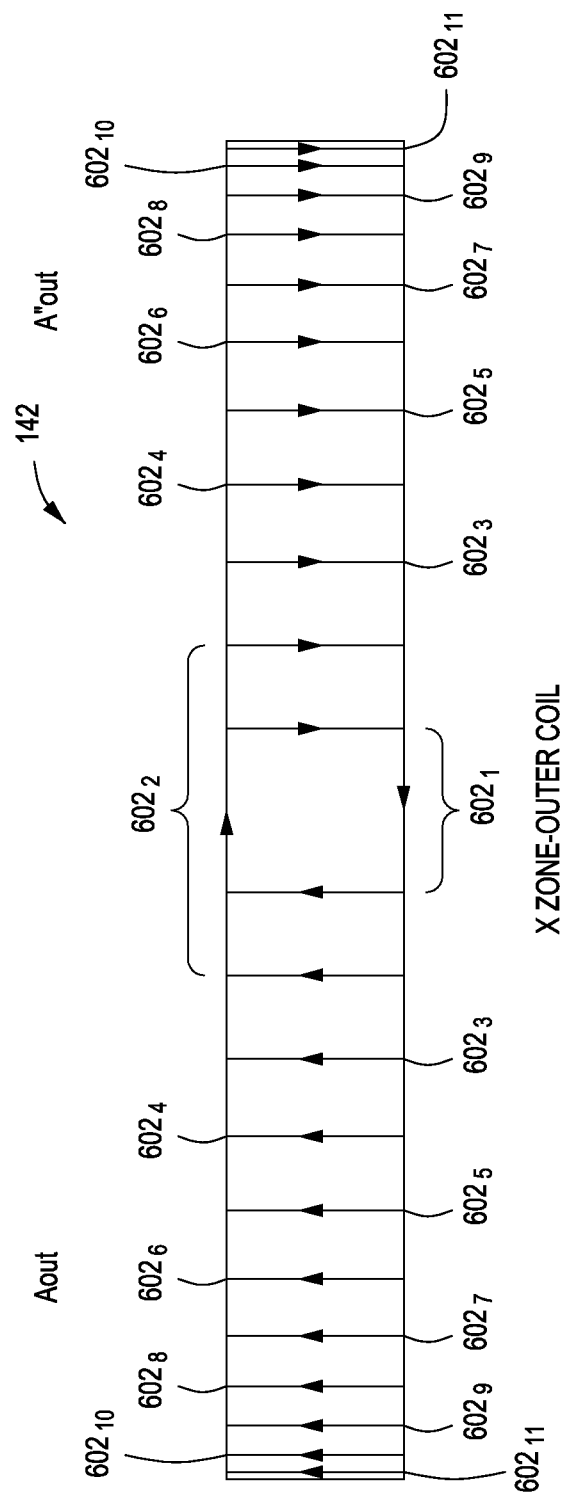
FIGS. 6A-B depict schematic side views of electromagnet coil configurations in accordance with some embodiments of the present disclosure.
Figure 6B:
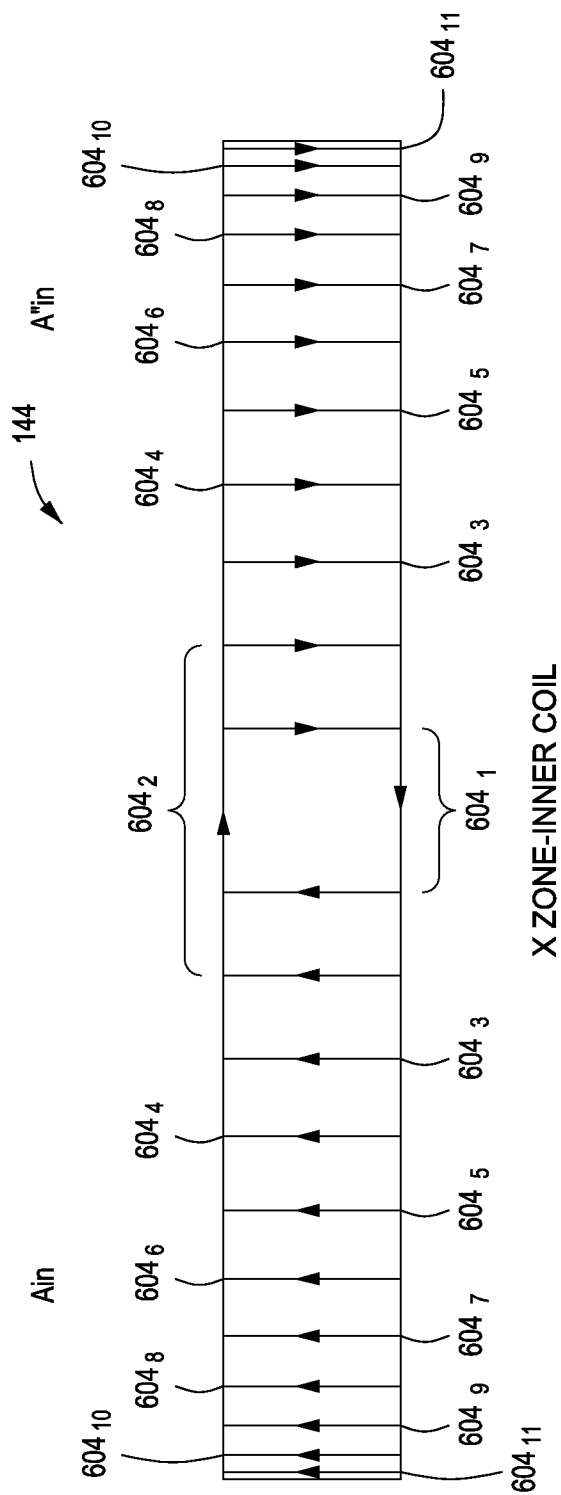

In some embodiments, each of the outer and inner rings of electromagnetic coils 142, 144 are "cosine-theta" (cos θ) coils that each include a plurality of sets of coils. Each cos θ coil 142, 144 consists of two sets cos θ windings disposed opposite each other to generate radial fields. For example, FIG. 6A shows a side view of the outer cos θ coil 142 that depicts a first set of n cos θ outer coils/windings $602_1$-$602n$. A second set of cos θ outer coils/windings $602'_1$-$602'_n$ disposed opposite the first set of coils can be seen in the top down view of the outer cos θ coil 142 in FIGS. 7A and 7B. Similarly, FIG. 6B shows a side view of the inner cos θ coil 144 that depicts a first set of n inner coils $604_1$-$604_n$. A second set of orthogonal cos θ inner windings $604'_1$-$604'_n$ can be seen in the top down view of the outer cos θ coil 144 in FIG. 3A. The shape formed by each coil $602_1$-$602_n$, $602'_1$-$602'_n$, $604_1$-$604_n$, and $604'_1$-$604'_n$ is a saddle shape as shown in FIG. 7B. In some embodiments, the number of sets/pairs of coils in each cos θ coil 142, 144 may be from 2 sets/pairs of coils (4 coils total) to about 50 sets/pairs of coils (100 coils total). In some embodiments, the number of sets/pairs of coils in each cos θ coil 142, 144 may be 32 sets/pairs.

Figure 7A:
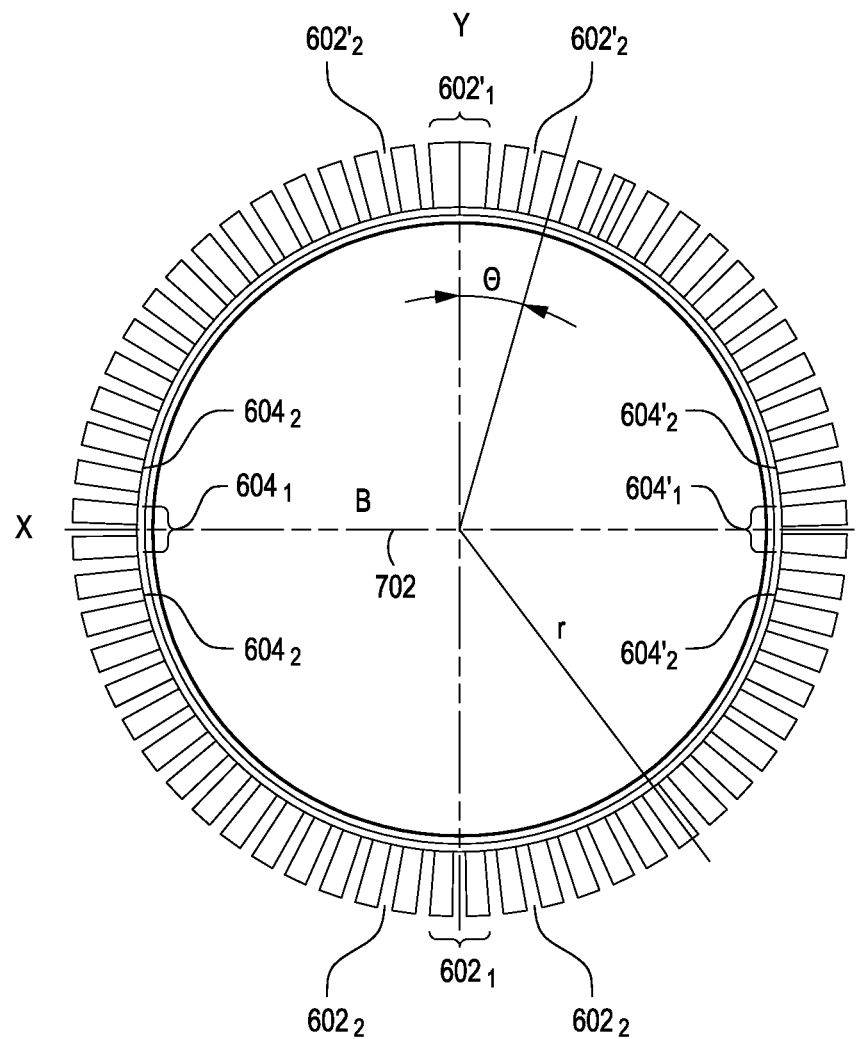
FIG. 7A depicts a top view of electromagnet coil configurations in accordance with some embodiments of the present disclosure.
Figure 7B:
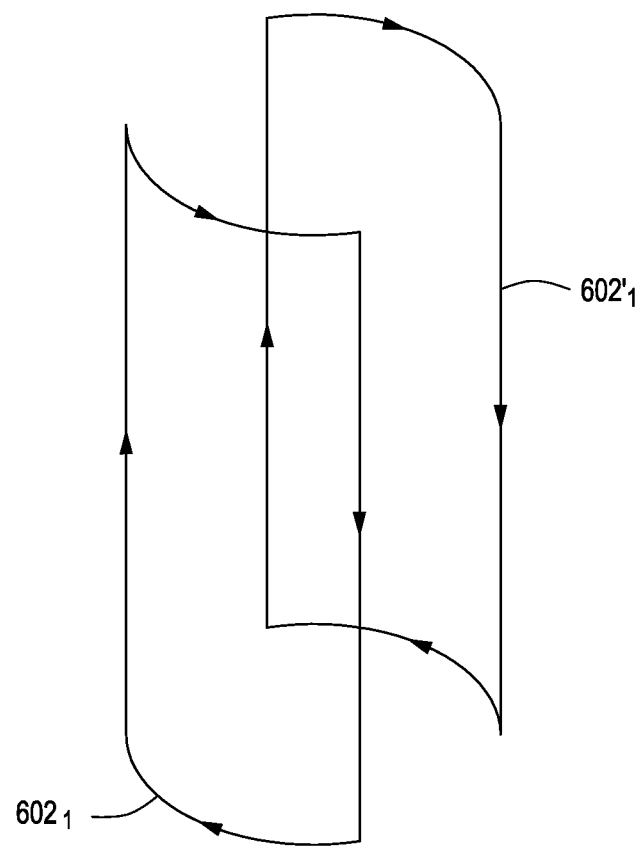
FIG. 7B depicts an isometric view of an exemplary electromagnet coil pair having a saddle-shape in accordance with some embodiments of the present disclosure.

As shown in FIGS. 7A and 7B, each cos θ coil 142, 144 includes series of saddle-shaped coils spaced uniformly with respect to cos θ on the curved cylindrical surface, where θ is the angle between the radius of the cylinder and the radial axis. Each cos θ coil 142, 144 consists of $N_{cp}$ coil pairs spaced uniformly with respect to cos θ on the curved surface of a cylinder whose base is in the xy-plane and length is along the x-axis, such that y=r cos θ. The number of turns/windings in each coil increases as θ increases to produce the cos θ coil. For example, in some embodiments, the coils may include the following number of turns to produce a cos θ distribution:

coils $602_1$, $602'_1$, $604_1$, and $604'_1$=4 turns
coils $602_2$, $602'_2$, $604_2$, and $604'_2$=8 turns
coils $602_3$, $602'_3$, $604_3$, and $604'_3$=10 turns
coils $602_4$, $602'_4$, $604_4$, and $604'_4$=12 turns
coils $602_5$, $602'_5$, $604_5$, and $604'_5$=14 turns
coils $602_6$, $602'_6$, $604_6$, and $604'_6$=16 turns
coils $602_7$, $602'_7$, $604_7$, and $604'_7$=18 turns
coils $602_8$, $602'_8$, $604_8$, and $604'_8$=20 turns
coils $602_9$, $602'_9$, $604_9$, and $604'_9$=22 turns
coils $602_{10}$, $602'_{10}$, $604_{10}$, and $604'_{10}$=24 turns
coils $602_n$, $602'_n$, $604_n$, and $604'_n$=Z turns Although the above example shows that the structure of the cos θ distribution of the outer coil 142 and the inner coil 144 are the same, in some embodiments the cos θ distribution between the outer coil 142 and the inner coil 144 may be different (i.e., the outer coil 142 and the inner coil 144 may have different spacing between coils, different number of sets of coils, and/or a different number of turns per coil.) In some embodiments, the number of turns for each coil included in the outer coil 142 and the inner coil 144 are the same, but the position of the windings may disposed such that the desired cos θ distribution is achieved.

Each coil in the outer cos θ coil 142 has the same current passing through each coil turn. Similarly, each coil in the inner cos θ coil 144 has the same current passing through each coil turn. At the extremities of the coil the current travels along the curved boundary of the circular base of the cylinder, in the xy-plane. In some embodiments, as shown in FIG. 7A, the X-Plane cos θ outer coil 142 is rotated 90 degrees from the Y-Plane cos θ inner coil 144 (i.e., the outer coil 142 and the inner coil 144 are disposed orthogonally to one another). Thus, the outer coil 142 can produce a constant transverse B-field in an X-direction, for example, while the inner coil 144 can produce a constant transverse B-field in a Y-direction. The interaction of the B-fields produce a single constant transverse B-field that can be controlled (i.e., magnitude and direction can be altered).

By providing power/current to at least one of the cos θ coils 142, 144, a constant transverse B-field 702 (i.e., magnetic field) may be produced in a plane substantially parallel to the surface of the substrate 128. A magnetic field is the magnetic influence of electric currents and magnetic materials. The magnetic field at any given point is specified by both a direction and a magnitude/strength and denoted as a vector B field measured in units of amp per meter. The B field is most commonly defined in terms of the Lorentz force it exerts on moving electric charges.

The inventors have observed that by controlling the magnitude and direction of the current supplied to each cos θ coil 142, 144, that the magnitude and direction of a constant transverse B-field 702 may be controlled. The inventors have further observed that by adjusting/controlling the magnitude and direction of a constant transverse B-field 702 in a plasma chamber, plasma uniformity and direction can be advantageously manipulated to correct for skew and other causes of substrate non-uniformity.

While the foregoing is directed to embodiments of the present disclosure, other and further embodiments of the disclosure may be devised without departing from the basic scope thereof.

The invention claimed is:

1. A coil assembly mandrel, comprising:
an annular body having a central opening configured to allow the coil assembly mandrel to be disposed in semiconductor processing chamber, wherein the annular body includes an internal coolant channel comprising a body coolant inlet through which a coolant fluid flows into the internal coolant channel, which is fluidly coupled to at least one body coolant inlet channel, which is fluidly coupled to at least one body coolant outlet channel, which is fluidly coupled to a body coolant outlet through which the coolant flows out of the internal coolant channel,
wherein the entire coolant channel is disposed completely internal to, and located within the coil assembly mandrel from the body coolant inlet to the body coolant outlet, such that any of the coolant flowing from the body coolant inlet, through the coolant channel, to the body coolant outlet, does not contact an outer surface of the coil assembly mandrel; and
a plurality of cooling fins disposed circumferentially about an outer diameter of the annular body, each having a central axis oriented radially outward from the outer diameter of the annular body, each of the cooling fins suitable to support a plurality of coils wrapped around the cooling fin which are oriented orthogonal to the central axis of the cooling fin,
wherein at least one of the cooling fins is an active cooling fin, and
wherein the active cooling fin includes the at least one cooling fin channel formed within the active cooling fin, comprising a cooling fin inlet fluidly coupled to a cooling fin outlet through the internal cooling fin channel, wherein the cooling fin inlet is fluidly coupled to the at least one body coolant inlet channel, and the cooling fin outlet is fluidly coupled to the at least one body coolant outlet channel.

2. The coil assembly mandrel of claim 1, wherein the at least one body coolant inlet channel is located above the at least one body coolant outlet channel.

3. The coil assembly mandrel of claim 1, wherein the at least one internal cooling fin channel formed within the active cooling fin includes:
an internal cooling fin inlet channel fluidly coupled to an internal cooling fin outlet channel,
wherein the internal cooling fin inlet channel extends radially outward from the annular body to an outer edge of the active cooling fin, and wherein the internal inlet cooling fin channel is fluidly coupled to the body coolant inlet channel through the cooling fin inlet; and
wherein the internal cooling fin outlet channel extends radially outward from the annular body to an outer edge of the active cooling fin, wherein the internal cooling fin outlet channel is fluidly coupled to the body coolant outlet channel through the cooling fin outlet.

4. The coil assembly mandrel of claim 1, wherein the internal coolant channel is configured to flow coolant through the entire circumference of the annular body.

5. The coil assembly mandrel of claim 4, wherein the body coolant inlet and the body coolant outlet are configured to reverse the flow of a coolant provided therein.

6. The coil assembly mandrel of claim 1, wherein the at least one body coolant inlet channel is fluidly sealed by an upper cap and the at least one body coolant outlet channel is fluidly sealed by a lower cap.

7. The coil assembly mandrel of claim 1, wherein the coil assembly mandrel is formed from aluminum.

8. The coil assembly mandrel of claim 1, wherein each cooling fin has an I-Beam structural shape in a cross section orthogonal to the central axis of the cooling fin, and configured to improve airflow when one or more coils are wrapped about the cooling fin orthogonal to the central axis of the cooling fin, wherein the one or more coils are wrapped about the central axis of the cooling fin.

9. The coil assembly mandrel of claim 1, wherein the cooling fins are arranged and spaced about the outer diameter of the annular body such that a plurality of openings are formed between each pair of cooling fins and configured to promote airflow and cooling of the coil assembly mandrel.

10. A coil assembly, comprising:
a mandrel comprising:
an annular body having a central opening configured to allow the coil assembly to be disposed in semiconductor processing chamber, that includes an internal coolant channel comprising a body coolant inlet through which a coolant fluid flows into the internal coolant channel, which is fluidly coupled to at least one body coolant inlet channel, which is fluidly coupled to at least one body coolant outlet channel, which is fluidly coupled to a body coolant outlet through which the coolant flows out of the internal coolant channel, wherein the entire coolant channel is disposed completely internal to, and located within the coil assembly mandrel from the body coolant inlet to the body coolant outlet, such that any of the coolant flowing from the body coolant inlet, through the coolant channel, to the body coolant outlet, does not contact an outer surface of the coil assembly mandrel; and a plurality of cooling fins disposed circumferentially about an outer diameter of the annular body, each having a central axis oriented radially outward from the outer diameter of the annular body, each of the cooling fins suitable to support a plurality of coils wrapped around the cooling fin which are oriented orthogonal to the central axis of the cooling fin, wherein at least one of the cooling fins is an active cooling fin, and wherein the active cooling fin includes the at least one cooling fin channel formed within the active cooling fin, comprising a cooling fin inlet fluidly coupled to a cooling fin outlet through the internal cooling fin channel, wherein the cooling fin inlet is fluidly coupled to the at least one body coolant inlet channel, and the cooling fin outlet is fluidly coupled to the at least one body coolant outlet channel; an inner electromagnetic cosine-theta (cos θ) coil ring including a first set of inner cos θ coils wrapped around the plurality of cooling fins of the annular body and configured to generate a magnetic field in a first direction; and an outer electromagnetic cosine-theta (cos θ) coil ring including a second set of outer cos θ coils wrapped around the plurality of cooling fins and configured to generate a magnetic field in a second direction orthogonal to the first direction.

11. The coil assembly of claim 10, wherein the first set of inner cos θ coils consists of two sets of cos θ windings disposed opposite each other to generate radial fields.

12. The coil assembly of claim 11, wherein each of the first set of inner cos θ coils has a saddle coil shape.

13. The coil assembly of claim 10, wherein the second set of outer cos θ coils consists of two sets of cos θ windings disposed opposite each other to generate radial fields.

14. The coil assembly of claim 13, wherein each of the second set of outer cos θ coils has a saddle coil shape.

15. The coil assembly of claim 10, wherein the inner electromagnetic cos θ coil ring and the outer electromagnetic cos θ coil ring are configured to generate a constant transverse B-field.

16. The coil assembly of claim 10, wherein the active cooling fin comprises:
an internal cooling fin inlet channel fluidly coupled to an internal cooling fin outlet channel, wherein the internal cooling fin inlet channel extends radially outward from the annular body to an outer edge of the active cooling fin, and wherein the internal inlet cooling fin channel is fluidly coupled to the body coolant inlet channel through the cooling fin inlet; and
wherein the internal cooling fin outlet channel extends radially outward from the annular body to an outer edge of the active cooling fin, wherein the internal cooling fin outlet channel is fluidly coupled to the body coolant outlet channel through the cooling fin outlet.

17. The coil assembly of claim 10, wherein the internal coolant channel is configured to flow coolant through the entire circumference of the body.

18. The coil assembly of claim 17, wherein the body coolant inlet and the body coolant outlet are configured to reverse the flow of a coolant provided therein.

19. An apparatus for processing a substrate, comprising:
a process chamber having an internal processing volume;
a substrate support disposed in the process chamber to support a substrate when disposed therein;
a coil assembly including an aluminum mandrel comprising:
an annular body having a central opening configured to allow the coil assembly to be disposed in semiconductor processing chamber, and which includes an internal coolant channel comprising a body coolant inlet through which a coolant fluid flows into the internal coolant channel, which is fluidly coupled to at least one body coolant inlet channel, which is fluidly coupled to at least one body coolant outlet channel, which is fluidly coupled to a body coolant outlet through which the coolant flows out of the internal coolant channel, wherein the entire coolant channel is disposed completely internal to, and located within the coil assembly mandrel from the body coolant inlet to the body coolant outlet, such that any of the coolant flowing from the body coolant inlet, through the coolant channel, to the body coolant outlet, does not contact an outer surface of the coil assembly mandrel; and a plurality of cooling fins disposed circumferentially about an outer diameter of the annular body, each having a central axis oriented radially outward from the outer diameter of the annular body, each of the cooling fins suitable to support a plurality of coils wrapped around the cooling fin which are oriented orthogonal to the central axis of the cooling fin, wherein at least one of the cooling fins is an active cooling fin, and wherein the active cooling fin includes the at least one cooling fin channel formed within the active cooling fin, comprising a cooling fin inlet fluidly coupled to a cooling fin outlet through the internal cooling fin channel, wherein the cooling fin inlet is fluidly coupled to the at least one body coolant inlet channel, and the cooling fin outlet is fluidly coupled to the at least one body coolant outlet channel;

an inner electromagnetic cosine-theta (cos θ) coil ring including a first set of inner coils wrapped around the plurality of cooling fins in the body and configured to generate a magnetic field in a first direction; and an outer electromagnetic cosine-theta (cos θ) coil ring including a second set of outer coils wrapped around the plurality of cooling fins and configured to generate a magnetic field in a second direction orthogonal to the first direction.

20. The apparatus of claim 19, further comprising:
a first power supply coupled to the inner electromagnetic cos θ coil ring configured to supply a first current to the first set of inner coils;
a second power supply coupled to the outer electromagnetic cos θ coil ring configured to supply a second current to the second set of outer coils; and
a controller communicatively coupled to the first and second power supplies, wherein the controller is configured to adjust at least one of magnitude or a direction of at least one of the first or second currents to control a magnitude and direction of a constant transverse B-field produced by the inner electromagnetic cos θ coil ring and the outer electromagnetic cos θ coil ring.

* * * * *